United States Patent [19]
Choi et al.

[11] Patent Number: 5,899,712
[45] Date of Patent: May 4, 1999

[54] METHOD FOR FABRICATING SILICON-ON-INSULATOR DEVICE

[75] Inventors: Ki Sik Choi; Yo Hwan Koh, both of Ichon, Rep. of Korea

[73] Assignee: Hyundai Electronics Industries Co., Ltd., Kyoungki-do, Rep. of Korea

[21] Appl. No.: 08/696,163

[22] Filed: Aug. 13, 1996

[30] Foreign Application Priority Data

Aug. 21, 1995 [KR] Rep. of Korea ...................... 95-25649
Dec. 29, 1995 [KR] Rep. of Korea ...................... 95-66069

[51] Int. Cl.$^6$ ................................................. H01L 21/84
[52] U.S. Cl. ............................................. 438/163; 438/459
[58] Field of Search .................................... 438/151, 455, 438/456, 457, 458, 459, 154, 162, 163, 164

[56] References Cited

U.S. PATENT DOCUMENTS

| | | |
|---|---|---|
| 4,851,078 | 7/1989 | Short et al. . |
| 5,071,785 | 12/1991 | Nakazato et al. . |
| 5,091,334 | 2/1992 | Yamazaki et al. . |
| 5,426,062 | 6/1995 | Hwang . |
| 5,532,175 | 7/1996 | Racanelli et al. . |
| 5,543,338 | 8/1996 | Shimoji . |
| 5,569,935 | 10/1996 | Takemura et al. .......................... 257/51 |
| 5,656,537 | 8/1997 | Iwamatsu et al. ....................... 438/402 |
| 5,665,613 | 9/1997 | Nakashima et al. ..................... 438/151 |
| 5,726,082 | 3/1998 | Park et al. ............................... 438/165 |

FOREIGN PATENT DOCUMENTS 01152638 6/1989 Japan ............................. H01L 21/68

*Primary Examiner*—Richard A. Booth
*Attorney, Agent, or Firm*—Nath & Associates; Gary M. Nath; Harold L. Novick

[57] ABSTRACT

A method for fabricating an SOI wafer, which involves bonding a plurality of wafers each provided at its upper surface with an oxide film in such a manner that the oxide film of each wafer is upwardly disposed, heating the resulting wafer structure to form an ingot, and cutting the ingot into pieces which will be used as SOI wafers. Accordingly, it is possible to achieve an improvement in productivity in the fabrication of SOI wafers. As a result, mass production can be achieved. The invention also provides a method for fabricating an SOI device, which involves forming a silicon film having a desired thickness beneath a field oxide film and implanting impurity ions in the silicon film, thereby forming doped regions. Accordingly, it is possible to solve the problem caused by floating of the semiconductor substrate.

7 Claims, 4 Drawing Sheets

METHOD FOR FABRICATING SILICON-ON-INSULATOR DEVICE

BACKGROUND OF THE INVENTION

1. Field of the Invention

The present invention relates to a method for fabricating a semiconductor device, and more particularly to a method for fabricating a silicon-on-insulator (SOI) device.

2. Description of the Prior Art

SOI wafers are expected to be applicable to semiconductor devices with an ultra-high integration degree, for example, DRAM's of 1 Giga grade or greater. Such SOI wafers consist of an oxide film and a silicon film formed over the oxide film. These SOI wafers provide an ideal insulation among devices fabricated on the silicon film. Accordingly, it is possible to obtain various advantages, for example, prevention of a latch-up phenomenon, a reduced hot electron effect, a reduced short channel effect, etc.

When such SOI wafers are used, it is also possible to greatly reduce the number of steps in the well forming process. This results in a reduction in manufacturing cost.

On the other hand, SOI wafers are mainly fabricated using a bond and etch (BE) method or a separation by implanted oxygen (SIMOX) method. However, these methods are impractical because manufacturing cost is very high.

FIG. 1 illustrates the fabrication of an SOI wafer in accordance with the conventional BE method. In accordance with this method, two sheets of wafers 1 and 2 are first bonded together, as shown in FIG. 1. Thereafter, either wafer 1 or 2 (the wafer 2 in the illustrated case) is ground using processes of grinding-selective etching-polishing in such a manner that its silicon portion on which desired devices will be formed has a thickness a of about 0.1 µm after being ground.

As a result, the wafer, which is ground, is almost wasted. Furthermore, only one SOI wafer is fabricated every fabrication time in accordance with the BE method. Consequently, there is a problem in that the fabrication of SOI wafers is very inefficient.

Moreover, this method does not use the interface 3 with a perfect atomic bonding, but uses the interface 4 with an imperfect atomic bonding. As a result, there is a problem in that the reliance in the fabrication of semiconductor devices is degraded.

Meanwhile, bulk metal oxide semiconductor field effect transistors (MOSFET's) typically have a 4-terminal structure consisting of a gate, a source, a drain and a silicon substrate. However, MOSFET's with an SOI structure does not require connection of contacts and associated wiring to the silicon substrate, as differently from the bulk MOSFET's. Accordingly, MOSFET's with an SOI structure can have a compact chip size.

In the fabrication of CMOS devices, it is unnecessary to form wells. In this case, neighboring active regions of MOSFET's are insulated from one another. Accordingly, it is possible to prevent occurrence of a latch-up phenomenon.

In the case of an SOI device fabricated on a silicon thin film having a small thickness, its source/drain junction is formed throughout the thickness of the silicon thin film. The source/drain has little area junction capacitance. In this case, only a perimeter junction capacitance exists.

In this regard, SOI devices exhibit high-speed low-power consumption characteristics, as compared to bulk MOSFET's.

Now, an example of a conventional technique will be described in conjunction with FIG. 2.

FIG. 2 is a sectional view illustrating an SOI device fabricated in accordance with a conventional method.

In accordance with this method, a first silicon substrate 11 is prepared first, and a silicon oxide film 12 is formed over the first silicon substrate 11. A second silicon substrate 13 having a mesa shape is then formed on the silicon oxide film 12.

Thereafter, a pad oxide film (not shown) and a nitride film (not shown) are sequentially formed over the second silicon substrate 13. The nitride film and pad oxide film are then etched using an etch mask for exposing a portion of the second silicon substrate 13 corresponding to an element isolation region, thereby forming a nitride film pattern and a pad oxide film pattern.

The exposed surface portion of the second silicon substrate 13 is then oxidized, thereby forming a field oxide film 14 on the second silicon substrate 13.

Subsequently, the nitride film and pad oxide film pattern are sequentially removed using an etch process.

Thereafter, a gate oxide film 15 and a polysilicon layer are sequentially formed over the second silicon substrate 13. The polysilicon layer is then patterned to form a gate electrode 16.

Using the gate electrode 16 as a mask, impurity ions are then implanted in a high concentration in the second silicon substrate 13, thereby forming impurity regions 17.

An oxide film (not shown) is then formed over the entire upper surface of the resulting structure. The oxide film is then etched, thereby forming oxide film spacers 18 on side walls of the gate electrode 16.

Subsequently, an insulating film 19 is formed over the resulting structure. Using an etch mask for forming a contact hole, the insulating film 19 is etched until the gate electrode 16 and second silicon substrate 13 are exposed, thereby forming a contact hole (not shown).

Finally, a metal pattern 20 is formed on the exposed surface of the insulating film 19 provided with the contact hole in such a manner that it is buried in the contact hole.

However, the MOSFET having the above-mentioned SOI structure has various problems because the silicon thin film has a very small thickness and because no contact is formed on the semiconductor substrate.

For example, the thickness of the silicon thin film serves as a factor varying the threshold voltage of the MOSFET.

This characteristic will be described in detail. The threshold voltage of the MOSFET can be expressed as follows:

$$V_T = V_{FB} + Q_B / C_{OX}$$

where, $V_T$ represents threshold voltage, $V_{FB}$ represents flat band voltage, $Q_B$ represents bulk charge, and $C_{OX}$ represents capacitance of the oxide film.

Referring to the above equation, it can be found that the amount of charge in the channel varies depending on the thickness of the silicon thin film. The threshold voltage of the MOSFET with the SOI structure decreases as the thickness of the silicon thin film is reduced. Accordingly, a variation in thickness of the silicon thin film directly influences the threshold voltage of the MOSFET with the SOI structure.

The thickness range of the silicon thin film adjustable by recently developed techniques is 100 Å. This range may result in a variation in threshold voltage corresponding to about 0.1 Volt in the case of a MOSFET with an SOI structure.

On the other hand, the MOSFET with the above-mentioned SOI structure is also problematic in that there is no path for absorbing minority carriers generated when flowing charges in the saturated channel strike against molecules of silicon grains. This is because the semiconductor substrate is not provided with any contact. As a result, carriers flow into the source/drain via the field region, thereby generating a kink effect resulting in an increase in drain current.

Such a kink effect limits designing of circuits using a MOSFET with an SOI structure. Minority carriers generated in the channel region may be accumulated in the semiconductor substrate unless they are rapidly recombined. In this case, the bias of the semiconductor substrate increases. As a result, the threshold voltage of the MOSFET with the SOI structure is lowered.

The two factors mentioned above are regarded as the most significant problems associated with the use of SOI devices as a semiconductor device for the next generation.

On the other hand, FIG. 3 is a sectional view illustrating an SOI MOSFET fabricated in accordance with a conventional mesa etch method.

In accordance with this method, a first silicon substrate 21 is first prepared, and a silicon oxide film 22 is then formed over the first semiconductor substrate 21. A second silicon substrate 23 having a mesa shape is then formed on the silicon oxide film 22.

A pad oxide film (not shown) is then formed over the second silicon substrate 23. The pad oxide film is then etched using an etch mask for exposing a portion of the second silicon substrate 23 corresponding to an element isolation region, thereby forming a pad oxide film pattern. Using the pad oxide film pattern as an etch barrier, the second silicon substrate 23 is then etched.

Thereafter, a gate oxide film and a polysilicon layer are sequentially formed over the second silicon substrate 23. The polysilicon layer and gate oxide film are then sequentially patterned to form a gate oxide film pattern 24 and a gate electrode pattern 25.

Using the gate electrode pattern 25 and the gate oxide film pattern 24 as a mask, impurity ions are then implanted in a high concentration in the second silicon substrate 23, thereby forming impurity regions 26.

An oxide film (not shown) is then formed over the entire upper surface of the resulting structure. The oxide film is then etched, thereby forming oxide film spacers 27 on side walls of the gate electrode pattern 25.

Subsequently, an insulating film 28 is formed over the resulting structure. Using an etch mask for forming a contact hole, the insulating film 28 is etched until the gate electrode pattern 25 and second silicon substrate 23 are exposed, thereby forming a contact hole (not shown).

Finally, a metal pattern 29 is formed on the exposed surface of the insulating film 28 provided with the contact hole in such a manner that it is buried in the contact hole.

However, the method of FIG. 3 still has the problem involved in the fabrication of the SOI device shown in FIG. 2. Furthermore, the silicon substrate etched in the form of a mesa has the (111)-orientation at its etched surface, thereby varying the threshold voltage of the SOI MOSFET. As a result, a kink phenomenon occurs because two threshold voltages exist in the subthreshold region of the MOSFET.

The above-mentioned conventional methods for fabricating SOI devices have the following problems.

In the case of the method shown in FIG. 1, one of the wafers bonded together is almost wasted. Furthermore, only one SOI wafer is fabricated every fabrication time. Consequently, there is a problem in that the fabrication of SOI wafers is very inefficient.

Moreover, this method uses the interface with an imperfect atomic bonding. As a result, there is a problem in that the reliance in the fabrication of semiconductor devices is degraded.

On the other hand, the conventional methods shown in FIGS. 2 and 3 involve occurrence of a kink phenomenon because it is difficult to control threshold voltage due to a variation in thickness of the silicon substrate. As a result, there is a degradation in the characteristics of semiconductor devices fabricated in accordance with the methods of FIGS. 2 and 3.

SUMMARY OF THE INVENTION

Therefore, an object of the invention is to solve the above-mentioned problems involved in the prior art and to provide a method for fabricating an SOI device, capable of achieving greater a productivity in the fabrication of SOI wafers, thereby not only achieving mass production, but also achieving an improvement in efficiency of processes used in the fabrication of SOI wafers.

Another object of the invention is to provide a method for fabricating an SOI device, capable of eliminating floating of the semiconductor substrate, thereby achieving an improvement in characteristics of a semiconductor device using the SOI device.

In accordance with one aspect of the present invention, a method for fabricating a silicon-on insulator (SOI) device comprises the steps of: preparing a plurality of wafers each having a thickness larger than that of a typical wafer, taking into consideration a process margin for subsequent wafer treating processes; growing oxide films allowing each wafer to be used as an SOI wafer over upper and lower surfaces of each wafer, respectively; etching the oxide film grown on the surface of each wafer which will not be used; sequentially laminating and bonding the wafers; heating the laminated wafers at a melting point of silicon; and cutting desired portions of the laminated wafers, thereby obtaining wafers each having an SOI structure including each of the oxide films and silicon formed on the oxide film.

In accordance with another aspect of the present invention, a method for fabricating a silicon-on insulator (SOI) device comprises the steps of: forming a silicon oxide film over a first silicon substrate; forming a second silicon substrate on the silicon oxide film; oxidizing the second silicon substrate at its exposed portion by about 90% or less of its thickness, thereby forming a field oxide film; forming doped regions in the second silicon substrate left beneath the field oxide film; forming a gate oxide film over an element forming portion of the second silicon substrate, and forming a gate electrode over the gate oxide film; implanting impurity ions in a low concentration, opposite side portions of the second silicon substrate using the gate electrode as a mask, thereby forming lightly doped impurity regions; forming oxide film spacers on opposite side walls of the gate electrode; and implanting impurity ions in a high concentration in the second silicon substrate using the gate electrode, the oxide film spacers and the field oxide film as a mask, thereby forming highly doped impurity regions.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 4A to 4F are sectional views respectively illustrating sequential steps of a method for fabricating an SOI wafer in accordance with an embodiment of the present invention.

Figure 1:
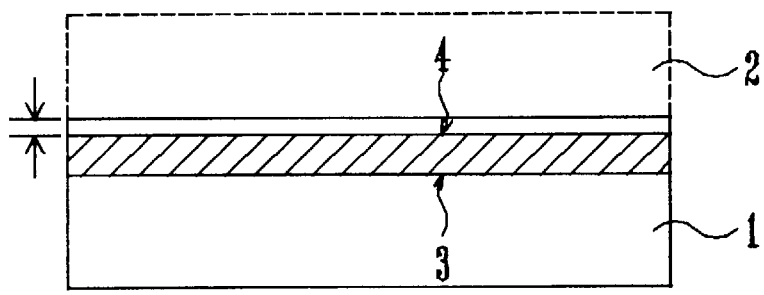
FIG. 1 is a sectional view illustrating the fabrication of an SOI wafer in accordance with a conventional BE method.
Figure 2:
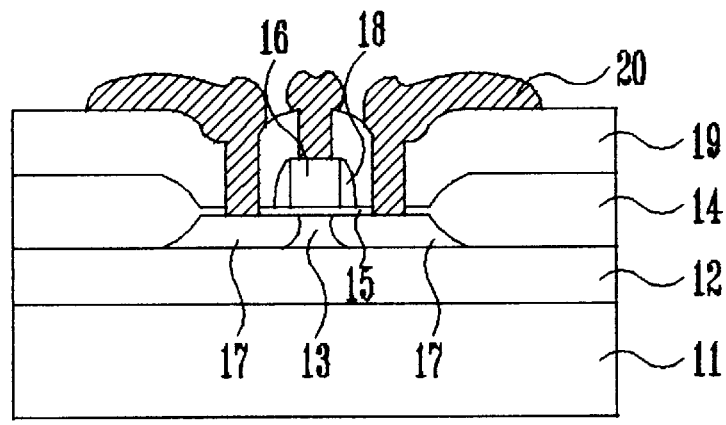
FIG. 2 is a sectional view illustrating an SOI device fabricated in accordance with a conventional method.
Figure 3:
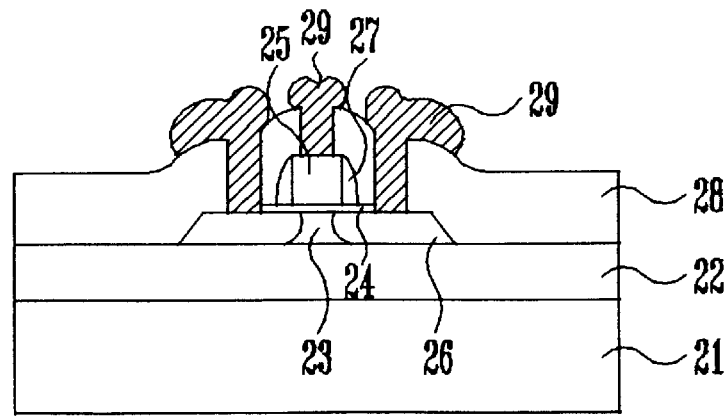
FIG. 3 is a sectional view illustrating an SOI MOSFET fabricated in accordance with a conventional mesa etch method.
Figure 4A:
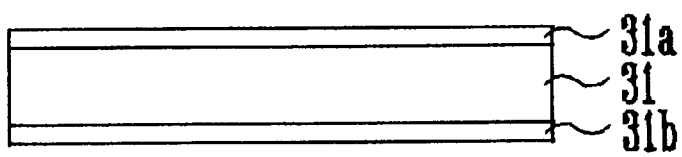
FIGS. 4A to 4F are sectional views respectively illustrating sequential steps of a method for fabricating an SOI wafer in accordance with an embodiment of the present invention.

In accordance with this method, a plurality of thick wafers 31, 32 . . . N-1 and N are first prepared. In FIG. 4A, only the wafer 31 is shown. Each wafer has a thickness of, for example, 1,000 to 1,100 $\mu$m, which is enough to provide a desired process margin for subsequent wafer fabrication steps. Thereafter, thermal oxide films 31a and 31b are grown over the upper and lower surfaces of each wafer, as shown in FIG. 4A. These thermal oxide films 31a and 31b are needed to use the wafer as a SOI wafer. Where 8-inch wafers are used, they typically have a thickness of about 710 to 740 $\mu$m. The thermal oxide films 31a and 31b have a grown thickness of about 0.2 to 0.4 $\mu$m.

Figure 4B:
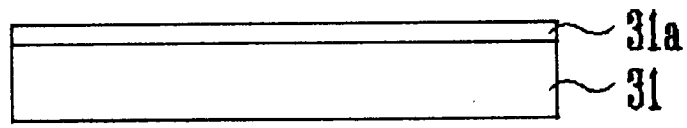

The thermal oxide film grown over the surface of each wafer, which will not be used in the fabricating a wafer, namely, the thermal oxide film 31b in the illustrated case, is then removed using a wet or dry etch process, as shown in FIG. 4B.

Figure 4C:
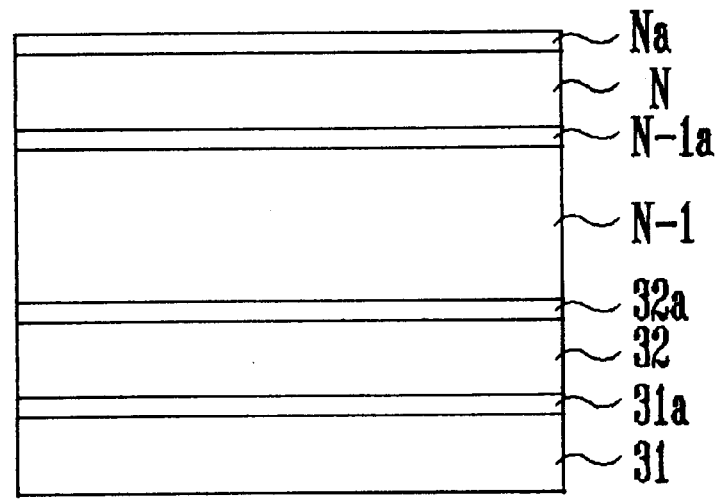

Subsequently, the wafers 31, 32 . . . N-1 and N are laminated and bonded together in such a manner that the remaining thermal oxide film of each wafer (the thermal oxide film 31a in the case of the wafer 31) is provided as the upper surface of that wafer, as shown in FIG. 4C. In FIG. 4C, the remaining thermal oxide films of the wafers 32 . . . and N sequentially laminated over the wafer 31 are denoted by the reference numerals 32a . . . N-1a and Na, respectively.

If possible, it is desirable to laminate the wafers together while aligning orientations of the wafers by utilizing flat zones of the wafers. To this end, it is desirable to prepare the wafers from one ingot.

The number of laminated wafers is appropriately determined to obtain a desired total height of, for example, several tens centimeters.

Thereafter, the laminated wafer structure is heated in a heating furnace at a temperature near the melting point of silicon, for example, a temperature of about 1,400 to 1,500° C. in order to enhance the bonding force among the laminated wafers 31, 32 . . . N-1 and N.

Figure 4D:
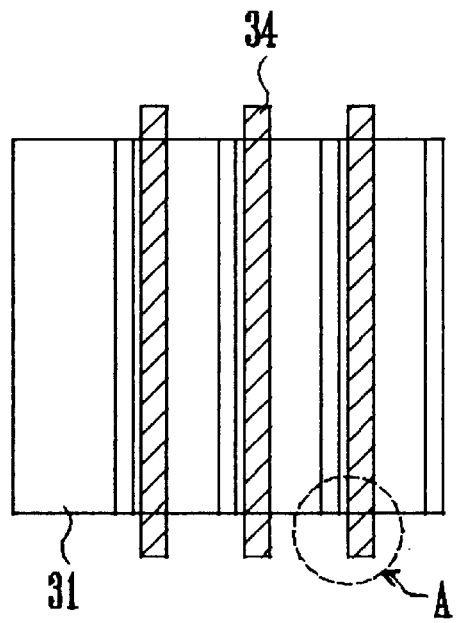

After the heating treatment, the resulting laminated wafer structure may be handled as one ingot. Under this condition, the laminated wafer structure is then cut into a plurality of pieces by a cutter, for example, an inner diameter slicer, as shown in FIG. 4D. In FIG. 4D, shaded areas 34 indicate areas where the wafer structure is cut.

Figure 4E:
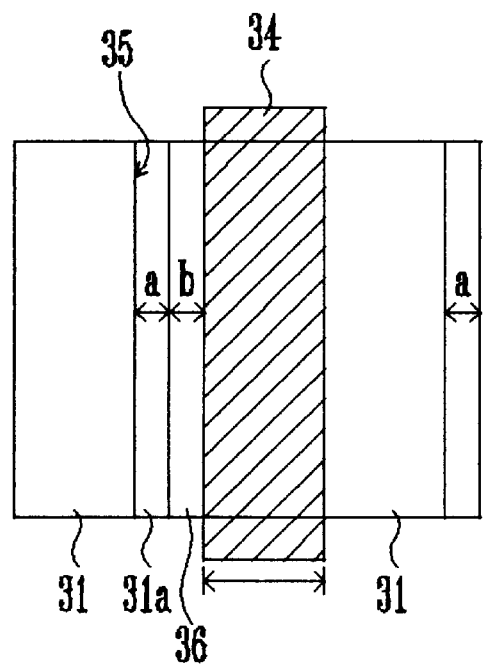
Figure 4F:
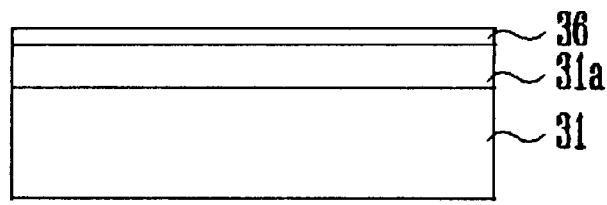

As shown in FIG. 4E which is an enlarged view of the portion A in FIG. 4D, the cutting is carried out at a portion of each wafer, except for the lowest wafer, spaced from the interface 35 between the oxide film disposed beneath the wafer to be cut and the wafer disposed beneath the oxide film by a distance of about 0.8 to 1.2 $\mu$m. This distance includes about 0,3 $\mu$m which is the thickness a of the oxide film and about 0.5 $\mu$m which is the thickness b of the wafer remaining on the oxide film.

In this case, since the cutter 34 has a thickness of about 330 $\mu$m, each wafer, which is cut, is wasted by its thickness corresponding to the thickness of the cutter 34. The reason why the initial thickness of each wafer is controlled to be about 1,000 to 1,100 $\mu$m is to allow wafers to have a final thickness of about 710 to 740 $\mu$m, taking into consideration the waste of the wafer thickness.

Thereafter, each wafer piece (FIG. 4F) obtained after the cutting, namely, each SOI wafer 36, is ground at its upper, thin silicon portion because its upper surface is uneven. The grinding of each SOI wafer 36 is carried out until the thickness of the thin silicon portion corresponds to about 0.1 $\mu$m.

As is apparent from the above description, SOI wafers can be easily fabricated by preparing wafers having a thickness larger than a desired thickness taking into consideration a process margin for subsequent fabrication processes, bonding the thick wafers together, and cutting the resulting wafer structure into desired pieces. Accordingly, it is possible not only to efficiently use the wafer material, but also to achieve an improvement in productivity. As a result, mass production is achieved.

When the conventional BE method is used, the waste of the wafer thickness is about 730 $\mu$m because the wafer is ground until it has a thickness of 0.1 $\mu$m. Accordingly, the method of the present invention can reduce the waste of silicon by 50% or more as compared to the conventional BE method because the waste of silicon is about 330 $\mu$m corresponding to the thickness of the cutter.

Although the conventional methods use grinding etching and polishing processes to grind one wafer sheet, the method of the present invention can easily form SOI wafers by using only the cutting and polishing processes. Accordingly, it is possible to achieve an improvement in process efficiency.

In accordance with the conventional methods, the oxide film disposed beneath the silicon layer has an interface with an imperfect atomic bonding. On the contrary, the oxide film has an interface with a perfect atomic bonding in accordance with the present invention. Accordingly, it is possible to achieve an improvement in reliance of semiconductor devices fabricated using the SOI wafer according to the present invention.

Figure 5A:
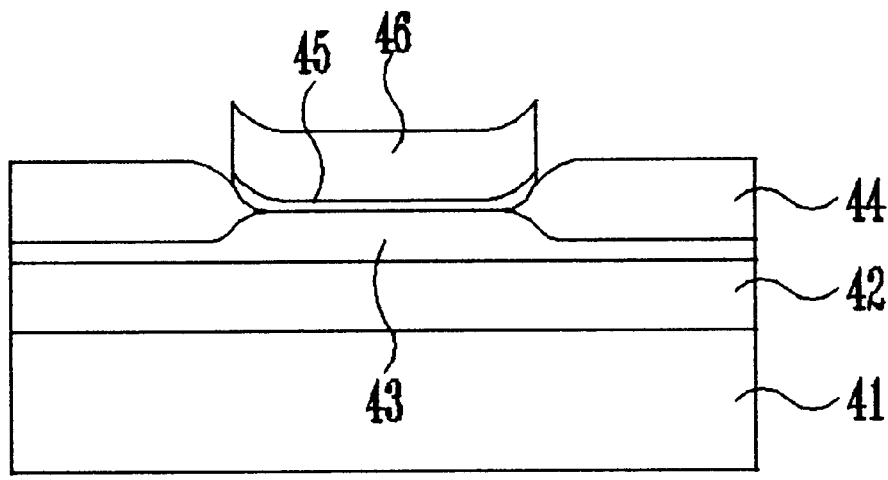
FIGS. 5A and 5B are sectional views respectively illustrating sequential steps of a method for fabricating a MOSFET with an SOI structure in accordance with another embodiment of the present invention.
Figure 5B:
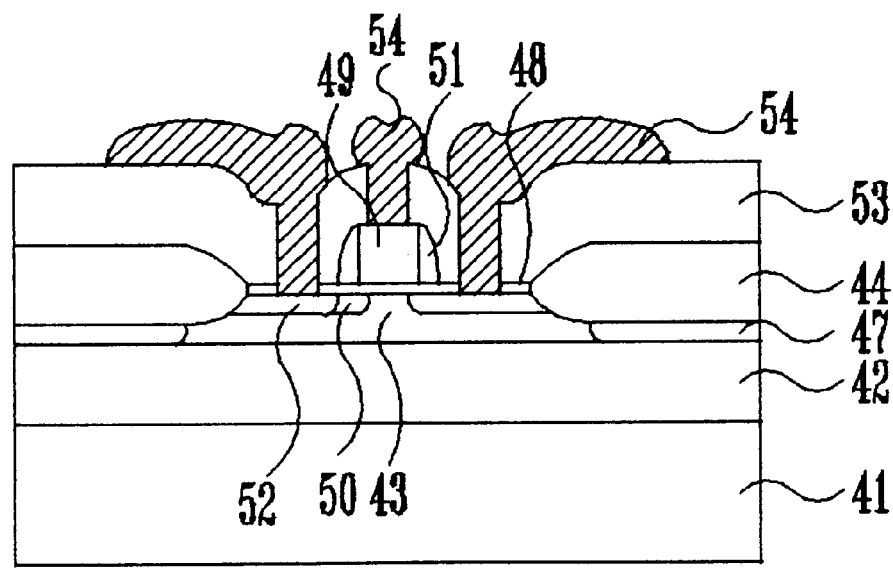

On the other hand, FIGS. 5A and 5B are sectional views respectively illustrating sequential steps of a method for fabricating a MOSFET with an SOI structure in accordance with another embodiment of the present invention.

In accordance with this method, a first silicon substrate 41 is first prepared, and a silicon oxide film 42 is then formed over the first semiconductor substrate 41, as shown in FIG. 5A. A second silicon substrate 43 having a desired thickness is then formed on the silicon oxide film 42.

A pad oxide film (not shown) and a nitride film (not shown) are then sequentially formed over the second silicon substrate 43. The nitride film and pad oxide film are then etched using an etch mask for exposing a portion of the second silicon substrate 43 corresponding to an element isolation region, thereby forming a pad oxide film pattern 45 and a nitride film pattern 46.

Thereafter, the second silicon substrate 43 is oxidized at its exposed portion by about 50 to 90% of its thickness, thereby forming a field oxide film 44.

The nitride film pattern 46 and pad oxide film pattern 45 are then removed, as shown in FIG. 5B.

Subsequently, a doped region 47 is formed at a portion of the second silicon substrate 43 disposed beneath the field oxide film 44 in accordance with a channel stop implant process.

Thereafter, a gate oxide film 48 and a polysilicon layer are sequentially formed over the second silicon substrate 43. The polysilicon layer is then patterned to form a gate electrode 49.

Using the gate electrode 49 as a mask, impurity ions are then implanted in a low concentration in the second silicon substrate 43, thereby forming lightly doped impurity regions 50.

An oxide film (not shown) is then formed over the entire upper surface of the resulting structure. The oxide film is then etched, thereby forming oxide film spacers 51 on side walls of the gate electrode 49.

Using the gate electrode 49 and oxide film spacers 51 as a mask, impurity ions are implanted in a high concentration in the second silicon substrate 43, thereby forming highly doped impurity regions 52.

Subsequently, an insulating film 53 is formed over the resulting structure. Using an etch mask for forming a contact hole, the insulating film 53 is etched until the gate electrode 49 or gate oxide film 48 is exposed, thereby forming a contact hole (not shown).

A metal pattern 54 is then formed on the exposed surface of the insulating film 53 provided with the contact hole in such a manner that it is buried in the contact hole.

In accordance with this method, it is possible to solve a problem caused by floating of the silicon substrate because the doped regions are formed by implanting impurity ions in a portion of the silicon substrate left beneath the field oxide film to a desired thickness.

As is apparent from the above description, the present invention provides a method for fabricating an SOI wafer, which involves bonding a plurality of wafers each provided at its upper surface with an oxide film in such a manner that the oxide film of each wafer is upwardly disposed, heating the resulting wafer structure to form an ingot, and cutting the ingot into pieces which will be used as SOI wafers. Accordingly, it is possible to achieve an improvement in productivity in the fabrication of SOI wafers. As a result, mass production can be achieved.

The present invention also provides a method for fabricating an SOI device, which involves forming a silicon film having a desired thickness beneath a field oxide film and implanting impurity ions in the silicon film, thereby forming doped regions. Accordingly, it is possible to solve a problem caused by floating of the semiconductor substrate.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a silicon-on insulator (SOI) device comprising the steps of:

forming a silicon oxide film over a first silicon substrate;

forming a second silicon substrate on the silicon oxide film;

oxidizing the second silicon substrate at its exposed portion by about 50 to 90% of its thickness to form a field oxide film;

forming doped regions in the second silicon substrate left beneath the field oxide film in accordance with a channel stop implant process;

forming a gate oxide film over an element forming portion of the second silicon substrate, and forming a gate electrode over the gate oxide film;

implanting impurity ions in a low concentration in opposite side portions of the second silicon substrate using the gate electrode as a mask to form lightly doped impurity regions;

forming oxide film spacers on opposite side walls of the gate electrode; and implanting impurity ions in a high concentration in the second silicon substrate using the gate electrode, the oxide film spacers and the field oxide film as a mask to form highly doped impurity regions.

2. The method in accordance with claim 1, wherein the oxidizing step is carried out until the second silicon substrate is left to a thickness of about 100 to 2,000 Å.

3. The method in accordance with claim 1, wherein the step of oxidizing the second silicon substrate is carried out after forming a pad oxide film over the element forming portion of the second silicon substrate and forming a nitride film over the pad oxide film.

4. The method in accordance with claim 1, further comprising the steps of:

forming an insulating film over the entire upper surface of the resulting structure obtained after the formation of highly doped impurity regions;

selectively removing the insulation film to form contact holes for exposing the gate electrode and the highly doped impurity regions; and forming a metal pattern connected to the gate electrode and the highly doped impurity regions through the contact holes.

5. The method in accordance with claim 1, wherein the formation of the field oxide film is substituted by the steps of selectively etching the second silicon substrate in such a manner that the second silicon substrate is left to about 10% of its thickness, and burying an oxide film in a region where the second silicon substrate is etched.

6. A method for fabricating a silicon-on insulator (SOI) device, comprising the steps of:

forming a silicon oxide film over a first silicon substrate;

forming a second silicon substrate on the silicon oxide film;

oxidizing the second silicon substrate at its exposed portion by about 50 to 90% of its thickness to form a field oxide film;

forming doped regions in the second silicon substrate left beneath the field oxide film;

forming a gate oxide film over an element forming portion of the second silicon substrate, and forming a gate electrode over the gate oxide film;

implanting impurity ions in a low concentration in opposite side portions of the second silicon substrate using the gate electrode as a mask to form lightly doped impurity regions;

forming oxide film spacers on opposite side walls of the gate electrode;

implanting impurity ions in a high concentration in the second silicon substrate using the gate electrode, the oxide film spacers and the field oxide film as a mask to form highly doped impurity regions;

forming an insulating film over the entire upper surface of the resulting structure obtained after the formation of the highly doped impurity regions;

selectively removing the insulating film to form contact holes for exposing the gate electrode and the highly doped impurity regions; and forming a metal pattern connected to the gate electrode and the highly doped impurity regions through the contact holes.

7. A method as claimed in claim 1 wherein said lowly doped impurity regions and highly doped impurity regions are formed so that they do not come in contact with said silicon oxide film.

* * * * *

UNITED STATES PATENT AND TRADEMARK OFFICE
CERTIFICATE OF CORRECTION

PATENT NO. : 5,899,712
DATED : May 4, 1999
INVENTOR(S) : Choi et al

It is certified that error appears in the above-identified patent and that said Letters Patent is hereby corrected as shown below:

Drawing Sheet , consisting of Figure 5b should be deleted to be replaced with the drawing sheet, consisting of 5b, as shown on the attached page.

Signed and Sealed this

Fourth Day of January, 2000

Attest:

*Attesting Officer*  *Acting Commissioner of Patents and Trademarks*

UNITED STATES PATENT AND TRADEMARK OFFICE
CERTIFICATE OF CORRECTION

PATENT NO. : 5,899,712
DATED : May 4, 1999
INVENTOR(S) : Choi et al.

It is certified that error appears in the above-identified patent and that said Letters Patent is hereby corrected as shown below:

In the Drawing:

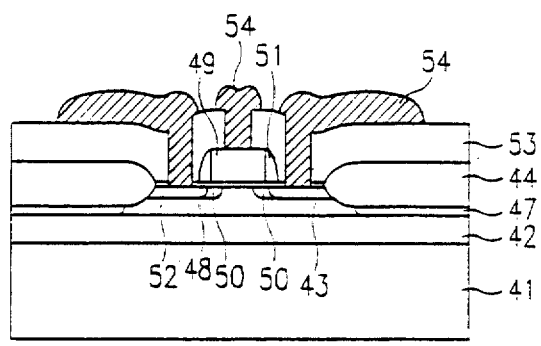

Fig.5b